US008884539B2

(12) United States Patent
Kitamura

(10) Patent No.: US 8,884,539 B2
(45) Date of Patent: Nov. 11, 2014

(54) RECTIFYING CIRCUIT AND POWER SUPPLY CIRCUIT

(71) Applicant: Toshiba Lighting & Technology Corporation, Yokosuka (JP)

(72) Inventor: Noriyuki Kitamura, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 70 days.

(21) Appl. No.: 13/832,206

(22) Filed: Mar. 15, 2013

(65) Prior Publication Data

US 2014/0232280 A1    Aug. 21, 2014

(30) Foreign Application Priority Data

Feb. 15, 2013  (JP) ................. 2013-027488

(51) Int. Cl.
*H05B 37/02*   (2006.01)
*H05B 33/08*   (2006.01)
*H02M 7/217*   (2006.01)

(52) U.S. Cl.
CPC ............ *H02M 7/217* (2013.01); *H05B 33/08* (2013.01)
USPC ....... 315/209 R; 315/276; 315/283; 315/287; 315/299

(58) Field of Classification Search
USPC ............. 315/209 R, 276, 283, 287, 291, 299
See application file for complete search history.

(56) References Cited

U.S. PATENT DOCUMENTS 7,825,435 B2    11/2010  Machida et al.
8,564,213 B2 *  10/2013  Esaki et al. ............... 315/200 R
2007/0121351 A1   5/2007  Zhang et al.
2008/0191216 A1   8/2008  Machida et al.
2009/0273292 A1 * 11/2009  Zimmermann ........... 315/209 R
2011/0128303 A1 *  6/2011  Yonemaru et al. ............. 345/690

FOREIGN PATENT DOCUMENTS

EP    2542029 A2    1/2013
JP    2008-198735 A  8/2008
WO    2012/009410 A1  1/2012

OTHER PUBLICATIONS

Zhao et al. "A Simple and Effective Method to Alleviate the Rectifier Reverse-Recovery Problem in Continuous-Current-Mode Boost Converters." IEEE Transactions on Power Electronics, vol. 16, No. 5, Sep. 1, 2001. pp. 649-658.
Jovanovic, Milan M. "A Technique for Reducing Rectifier Reverse-Recovery-Related Losses in High-Voltage, High-Power Boost Converters." Applied Power Electronics Conference and Exposition, vol. 2, Feb. 23, 1997. pp. 1000-1007.
Extended European Search Report dated Aug. 13, 2013 in European Application No. 13159377.4-1810.

* cited by examiner

*Primary Examiner* — Thuy Vinh Tran
(74) *Attorney, Agent, or Firm* — Banner & Witcoff, Ltd.

(57) ABSTRACT

According to one embodiment, a rectifying circuit includes a diode, a switching element, a capacitor and an auxiliary winding. The diode is connected between a first terminal and a second terminal while a direction directed from the second terminal to the first terminal is a forward direction. The switching element includes a first main electrode connected to the first terminal, a second main electrode connected to a cathode of the diode, and a gate electrode connected to an anode of the diode. The auxiliary winding is magnetically coupled to an inductor. The auxiliary winding is connected to the gate electrode through the capacitor, and is connected to the second main electrode of the switching element and the cathode of the diode.

20 Claims, 6 Drawing Sheets

US 8,884,539 B2

RECTIFYING CIRCUIT AND POWER SUPPLY CIRCUIT

CROSS-REFERENCE TO RELATED APPLICATION

This application is based upon and claims the benefit of priority from Japanese Patent Application No. 2013-027488, filed on Feb. 15, 2013; the entire contents of which are incorporated herein by reference.

FIELD

Embodiments described herein relate generally to a rectifying circuit and a power supply circuit.

BACKGROUND

A rectifying circuit is proposed in which a unipolar FET (Field Effect Transistor) as a normally-on element and a diode are cascode-connected. The switching speed of the rectifying circuit depends on the diode, and the element withstand voltage capacity depends on the FET.

When the rectifying circuit as stated above is used in, for example, a flywheel diode of a switching power supply operating at a high speed, a delay can occur in turning on due to a parasitic capacity between the gate and the source of the FET.

DETAILED DESCRIPTION

In general, according to one embodiment, a rectifying circuit includes a diode, a switching element, a capacitor and an auxiliary winding. The diode is connected between a first terminal and a second terminal while a direction directed from the second terminal to the first terminal is a forward direction. The switching element includes a first main electrode connected to the first terminal, a second main electrode connected to a cathode of the diode, and a gate electrode connected to an anode of the diode. The capacitor is connected to the gate electrode. The auxiliary winding is magnetically coupled to an inductor. The auxiliary winding is connected to the gate electrode through the capacitor, and is connected to the second main electrode of the switching element and the cathode of the diode.

Hereinafter, embodiments will be described with reference to the drawings. Incidentally, the same components in the respective drawings are denoted by the same reference signs.

First Embodiment

Figure 1:
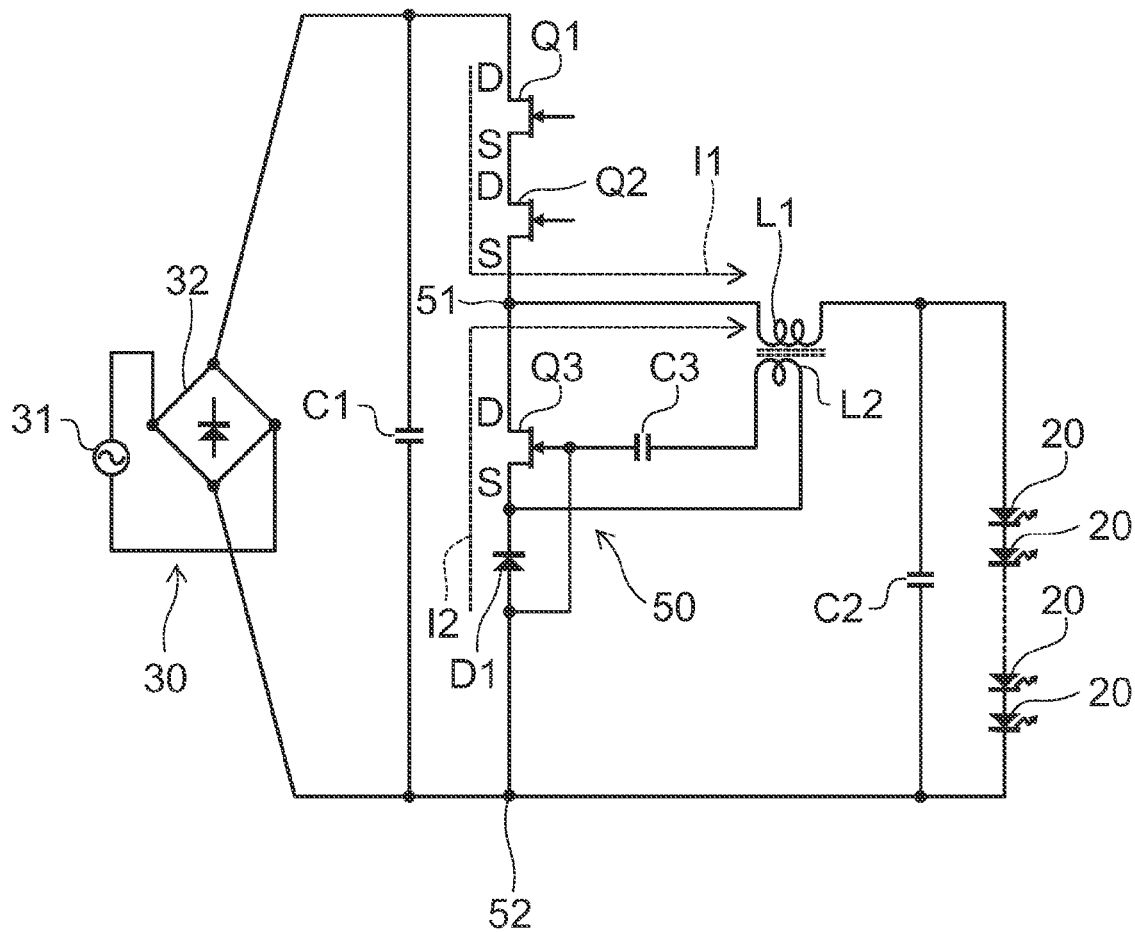
FIG. 1 is a circuit diagram of a power supply circuit of a first embodiment.

FIG. 1 is a circuit diagram of a power supply circuit using a rectifying circuit 50 of a first embodiment.

FIG. 1 exemplifies a falling voltage type DC-DC converter (back converter) as the power supply circuit.

High-side switching elements Q1 and Q2 connected to a DC power supply 30 and the rectifying circuit 50 are alternately turned on and off, so that the back converter outputs a voltage, which is lower than an input voltage from the DC power supply 30, to a load.

The load is, for example, a light-emitting element 20. The light-emitting element is, for example, an LED (Light Emitting Diode). Besides, an organic light emitting diode (OLED), an inorganic electroluminescence light-emitting element, an organic electroluminescence light-emitting element, or another electroluminescence light-emitting element can be used as the light-emitting element 20 in addition to the LED.

The DC power supply 30 mainly includes, for example, a bridge type rectifying circuit 32, and outputs a DC voltage by full-wave rectifying an AC voltage of an AC power supply (for example, commercial AC power supply). A capacitor C1 is connected to an output terminal of the DC power supply 30.

The rectifying circuit 50 includes a switching element Q3 and a diode D1 connected between a first terminal 51 and a second terminal 52. The switching element Q3 and the diode D1 are cascode-connected between the first terminal 51 and the second terminal 52.

The first terminal 51 functions as a cathode terminal in the rectifying circuit 50, and the second terminal 52 functions as an anode terminal in the rectifying circuit 50.

The switching element Q3 is a unipolar FET (Field Effect Transistor), and includes a drain electrode as a first main electrode, a source electrode as a second main electrode, and a gate electrode.

The switching element Q3 is a normally-on element which is on in a state where a control potential is not applied to the gate electrode. For example, an HEMT (High Electron Transistor) using a material having a band gap larger than that of silicon can be used as the switching element Q3.

The diode D1 is connected between the first terminal 51 and the second terminal 52 while a direction directed from the second terminal 52 to the first terminal 51 is a forward direction. The anode of the diode D1 is connected to the second terminal 52. The cathode of the diode D1 is connected to the source electrode of the switching element Q3. The diode D1 is, for example, a Schottky barrier diode.

The drain electrode of the switching element Q3 is connected to the first terminal 51. The source electrode of the switching element Q3 is connected to the cathode of the diode D1. The gate electrode of the switching element Q3 is connected to the anode of the diode D1. The threshold voltage of the gate electrode of the switching element Q3 is lower than the forward voltage of the diode D1.

Besides, the rectifying circuit 50 includes a capacitor C3 and an auxiliary winding L2.

The auxiliary winding L2 is magnetically coupled to an inductor L1. The capacitor C3 is connected between the gate electrode of the switching element Q3 and one end of the auxiliary winding L2.

The other end of the auxiliary winding L2 is connected to the source electrode of the switching element Q3 and the cathode of the diode D1.

As described later, in a state where the high-side switching elements Q1 and Q2 are off, a decreasing current flows through the inductor L1 via the rectifying circuit 50. The auxiliary winding L2 supplies an electric charge to the capacitor C3 by an induced electromotive force generated by the decreasing current flowing through the inductor L1.

The high-side switching elements Q1 and Q2 are connected between the DC power supply 30 and one end of the inductor L1. Incidentally, the number of the high-side switching elements is not limited to two.

The first terminal 51 of the rectifying circuit 50 is connected to the source electrode of the high-side switching element Q2. Besides, the first terminal 51 of the rectifying circuit 50 is connected to one end of the inductor L1.

The other end of the inductor L1 is connected to the output terminal of the back converter. A capacitor C2 for preventing an output voltage from largely varying in a short time is connected to the output terminal. Besides, for example, the light-emitting element 20 as a load is connected to the output terminal of the back converter.

Gate electrodes of the high-side switching elements Q1 and Q2 are connected to a not-shown control circuit, and on-off of the high-side switching elements Q1 and Q2 is controlled by a control signal from the control circuit. The high-side switching elements Q1 and Q2 are synchronously turned on and off.

Next, an operation of the power supply circuit (back converter) using the rectifying circuit 50 of the embodiment will be described with reference to FIGS. 2A to 2F.

The horizontal axis in FIGS. 2A to 2F represents time.

Figure 2:
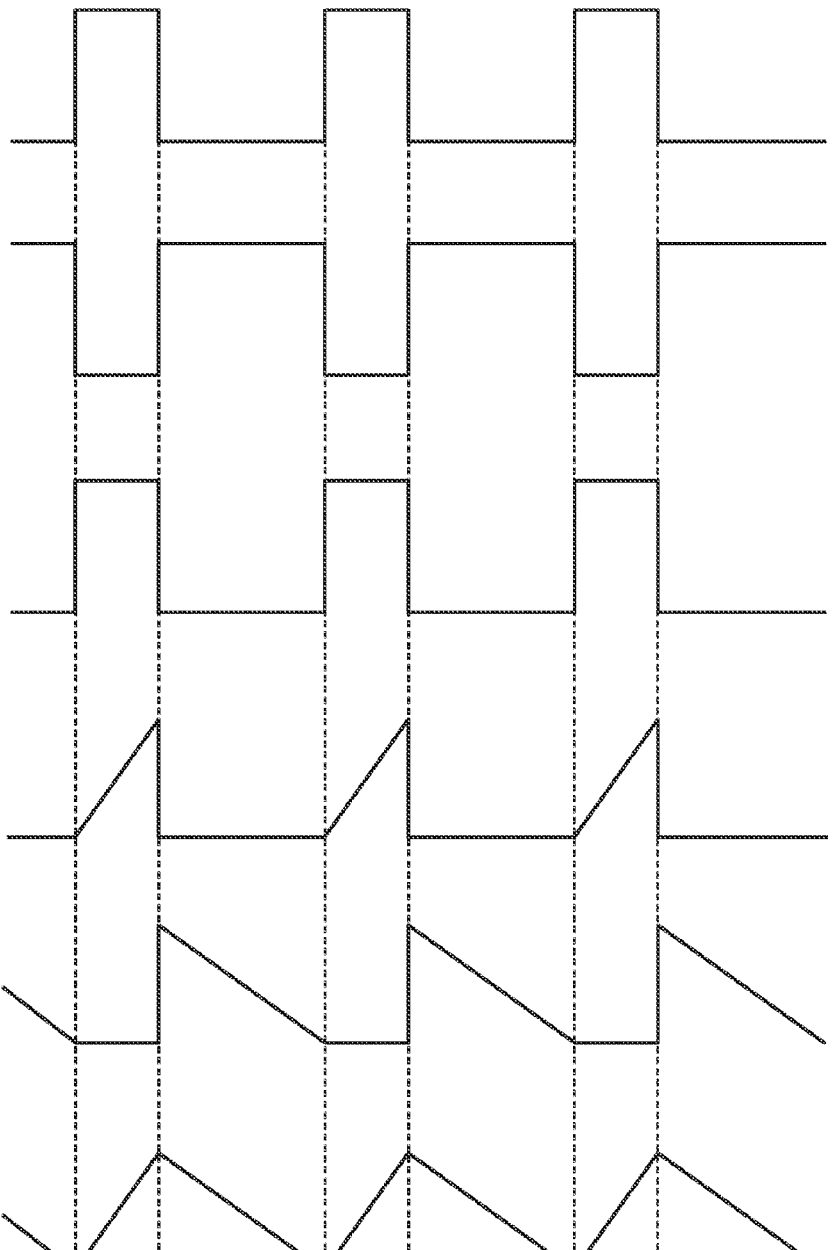
FIGS. 2A to 2F are timing charts showing an operation of the power supply circuit of the first embodiment.

FIG. 2A shows a drive voltage (gate potential) of the high-side switching elements Q1 and Q2.

FIG. 2B shows a drive voltage (gate potential) of the switching element Q3 of the rectifying circuit 50.

FIG. 2C shows a potential of the source electrode of the switching element Q3.

FIG. 2D shows a current flowing through the high-side switching elements Q1 and Q2.

FIG. 2E shows a current flowing through the rectifying circuit 50 in the forward direction.

FIG. 2F shows an inductor current flowing through the inductor L1.

When the gate potentials of the high-side switching elements Q1 and Q2 are at high level, the high-side switching elements Q1 and Q2 are turned on. Then, as shown in FIG. 2D, an increasing current increasing with time flows through the high-side switching elements Q1 and Q2. Besides, as shown in FIG. 2F, an increasing current flows also through the inductor L1. At this time, the gate potential of the switching element Q3 is at low level, and the switching element Q3 is off.

When the high-side switching elements Q1 and Q2 are on, and the switching element Q3 is off (the rectifying circuit 50 is off), a current I1 flows from the DC power supply 30 to the output terminal through the high-side switching elements Q1 and Q2 and the inductor L1. At this time, the inductor current increases, and energy is stored in the inductor L1.

When the high-side switching elements Q1 and Q2 are turned off, a regenerative current I2 flows to the output terminal through the rectifying circuit 50 and the inductor L1 by an electromotive force generated by the energy stored in the inductor L1. At this time, the current flowing through the rectifying circuit 50 and the inductor L1 is a decreasing current decreasing with time.

Since the high-side switching elements Q1 and Q2 and the rectifying circuit 50 are alternately turned on and off, the increase and decrease of the inductor current are repeated, and a DC current obtained by averaging the inductor current is supplied to the light-emitting element 20.

Here, the operation of the rectifying circuit 50 will be described.

When the high-side switching elements Q1 and Q2 are turned off, and the electromotive force is generated by the energy stored in the inductor L1, the potential of the first terminal 51 is decreased relative to the potential of the second terminal 52.

Then, the drain potential of the switching element Q3 starts to decrease. Further, the cathode potential of the diode starts to decrease, and the forward current starts to flow through the diode D1.

When the forward current flows through the diode D1, the forward voltage of the diode D1 is applied between the gate and the source of the switching element Q3, and the gate potential of the switching element Q3 starts to rise. Since the threshold voltage of the gate electrode of the switching element Q3 is lower than the forward voltage of the diode D1, the switching element Q3 is turned on.

At this time, there is a fear that a delay occurs in turning on of the switching element Q3 by parasitic capacitance between the gate and the source of the switching element Q3.

However, according to the embodiment, since the drive signal is applied to the gate electrode of the switching element Q3 through the capacitor C3 from the auxiliary winding L2 magnetically coupled to the inductor L1, the turning on of the switching element Q3 is hard to be influenced by the parasitic capacitance between the gate and the source.

That is, when the regenerative current (decreasing current) I2 flows through the inductor L2, an electric charge is supplied from the auxiliary winding L2 to the capacitor C3 by the induced electromotive force generated in the auxiliary winding L2, and the gate potential of the switching element Q3 rises.

Accordingly, according to the rectifying circuit 50 of the embodiment, the switching element Q3 can be turned on at high speed without receiving the influence of the parasitic capacitance. The rectifying circuit 50 as stated above is suitable for use as, for example, a flywheel diode of a switching power supply performing a high-speed switching operation.

When the switching element Q3 is turned on, the regenerative current I2 flows from the second terminal 52 to the inductor L1 through the diode D1 and the switching element Q3.

As the diode D1, a Schottky barrier diode is desirable which has low conduction loss as compared with a PN junction diode, a PIN structure diode or the like. Besides, in the Schottky barrier diode, reverse recovery time does not structurally exist or is very short, and the switch speed is high as compared with a PN junction diode, a PIN structure diode or the like.

The withstand voltage of the rectifying circuit 50 depends on the switching element Q3 having a higher withstand voltage than that of the diode D1.

Second Embodiment

Figure 3:
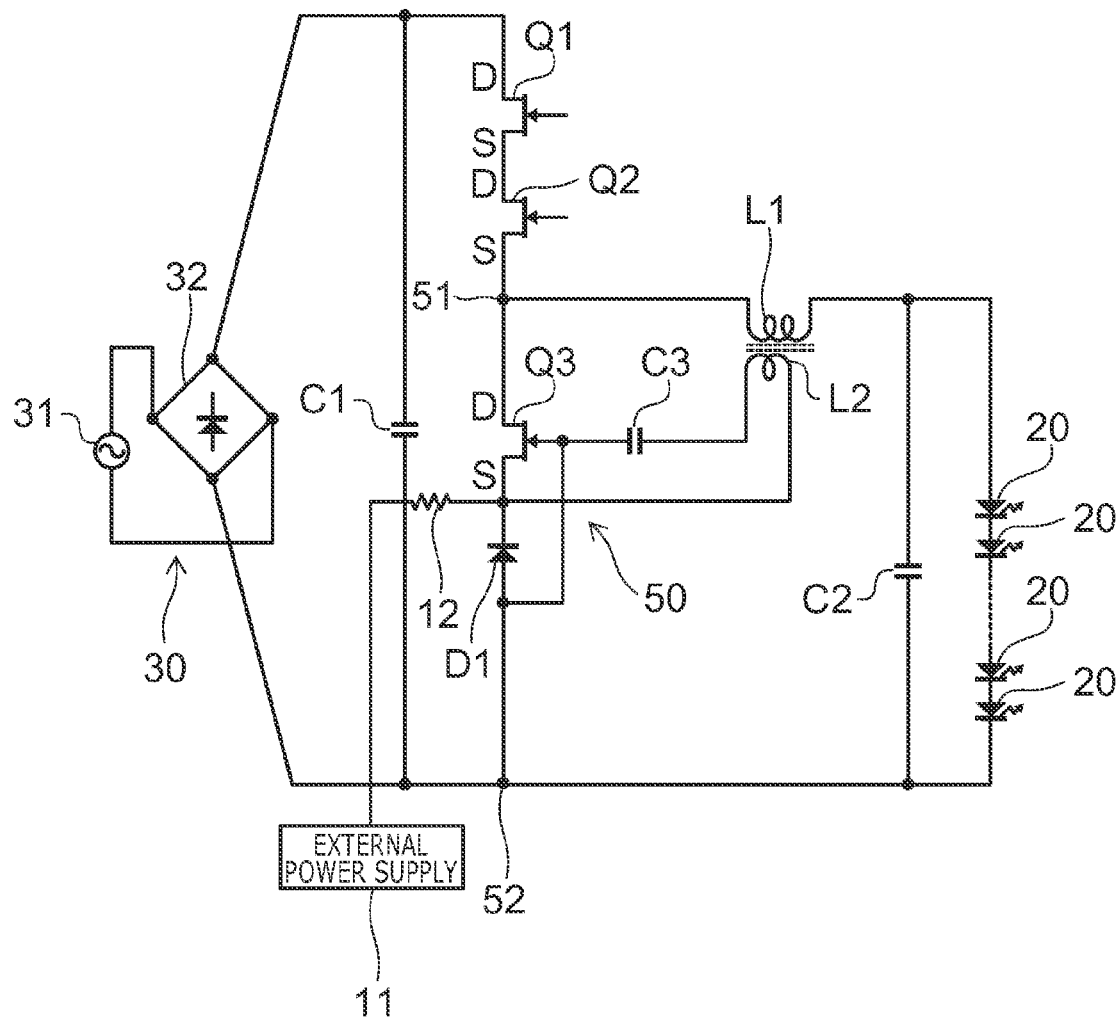
FIG. 3 is a circuit diagram of a power supply circuit of a second embodiment.

FIG. 3 is a circuit diagram of a power supply circuit of a second embodiment.

Also in the second embodiment, a back converter is exemplified as a power supply circuit. In the back converter of the second embodiment, an external power supply 11 is connected to a source electrode of a switching element Q3 and a cathode of a diode D1 through a resistor 12. The other structure is the same as that of the back converter shown in FIG. 1, and the operation is also the same.

The resistor 12 functions as a limiting element to limit a current in a direction from an auxiliary winding L2 to the external power supply 11.

Figure 4A:
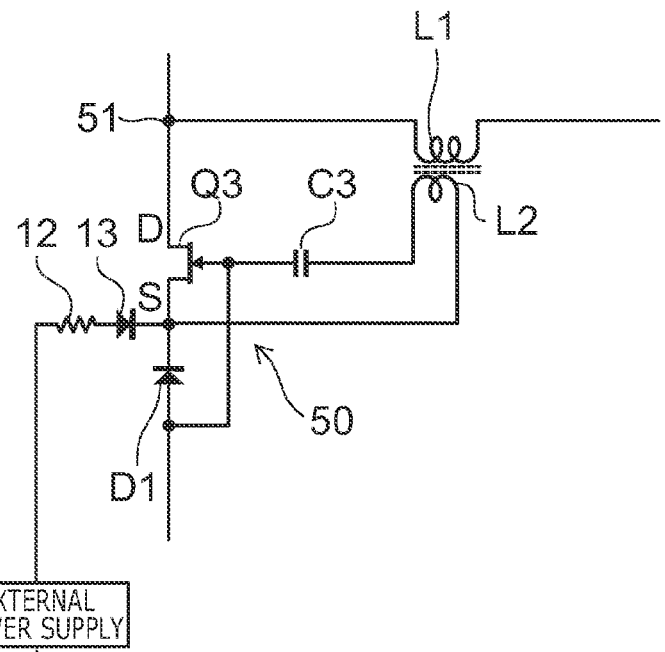
FIG. 4A and FIG. 4B are circuit diagrams of modified examples of the power supply circuit of the second embodiment.
Figure 4B:
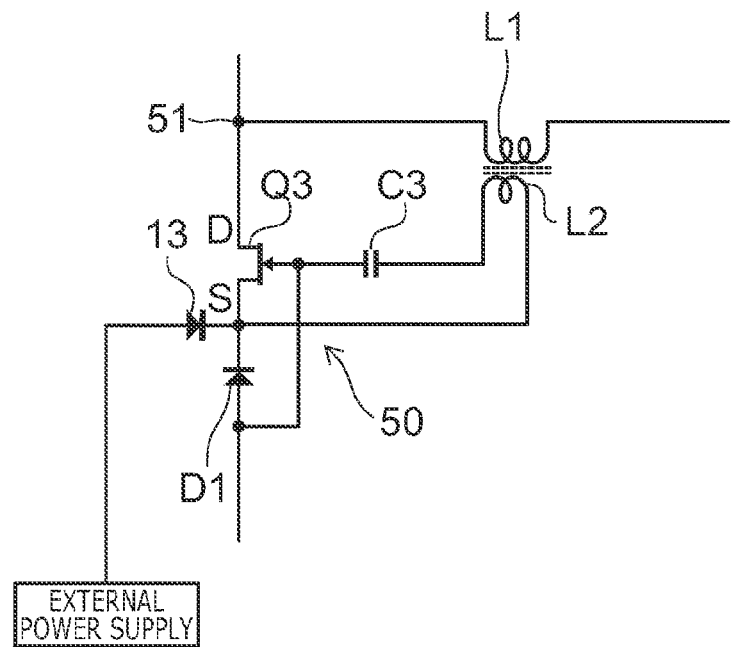

As the limiting element, a diode 13 may be used as shown in FIG. 4B. The diode 13 is connected between the external power supply 11 and the source electrode of the switching element Q3 while a direction directed from the external power supply 11 to the source electrode of the switching element Q3 is a forward direction.

Besides, as shown in FIG. 4A, the diode 13 may be provided in addition to the resistor 12. The diode 13 is connected between the resistor 12 and the source electrode of the switching element Q3 while a direction directed from the resistor 12 to the source electrode of the switching element Q3 is a forward direction.

The external power supply 11 is a DC constant voltage source to apply a voltage, which is lower than an input voltage inputted to an input terminal of the back converter from a DC power supply 30, to the source electrode of the switching element Q3. The external power supply 11 applies the voltage, which is lower than the input voltage to cause an increasing current to flow through an inductor L1 in a state where high-side switching elements Q1 and Q2 are on, to the source electrode of the switching element Q3.

A Schottky barrier diode has a high leakage current in reverse direction as compared with a PN junction diode. Thus, before the switching element Q3 is turned off, a leakage current can flow from the DC power supply 30 in the reverse direction of the diode D1 through the high-side switching elements Q1 and Q2 and the switching element Q3. In this case, the product of the output voltage of the DC power supply 30 and the leakage current becomes a loss.

On the other hand, according to the embodiment of FIG. 3, the DC voltage is applied to the source electrode of the switching element Q3 from the external power supply 11 which outputs the voltage lower than that of the DC power supply 30, so that the potential of the source electrode is raised, and turning off of the switching element Q3 is assisted.

The loss at this time is the product of the output voltage of the external power supply 11, which is lower than that of the DC power supply 30, and the reverse direction leakage current of the diode D1, and off of the switching element Q3 can be kept with the lower loss.

When an electromotive force is generated in the auxiliary winding L2, the current is regulated by the resistor 12, and when the switching element Q3 is turned on, a charging operation to the capacitor C3 from the auxiliary winding L2 is not influenced.

The rectifying circuit 50 of the embodiment described above can be applied to another power supply circuit other than the falling voltage type converter.

Figure 5:
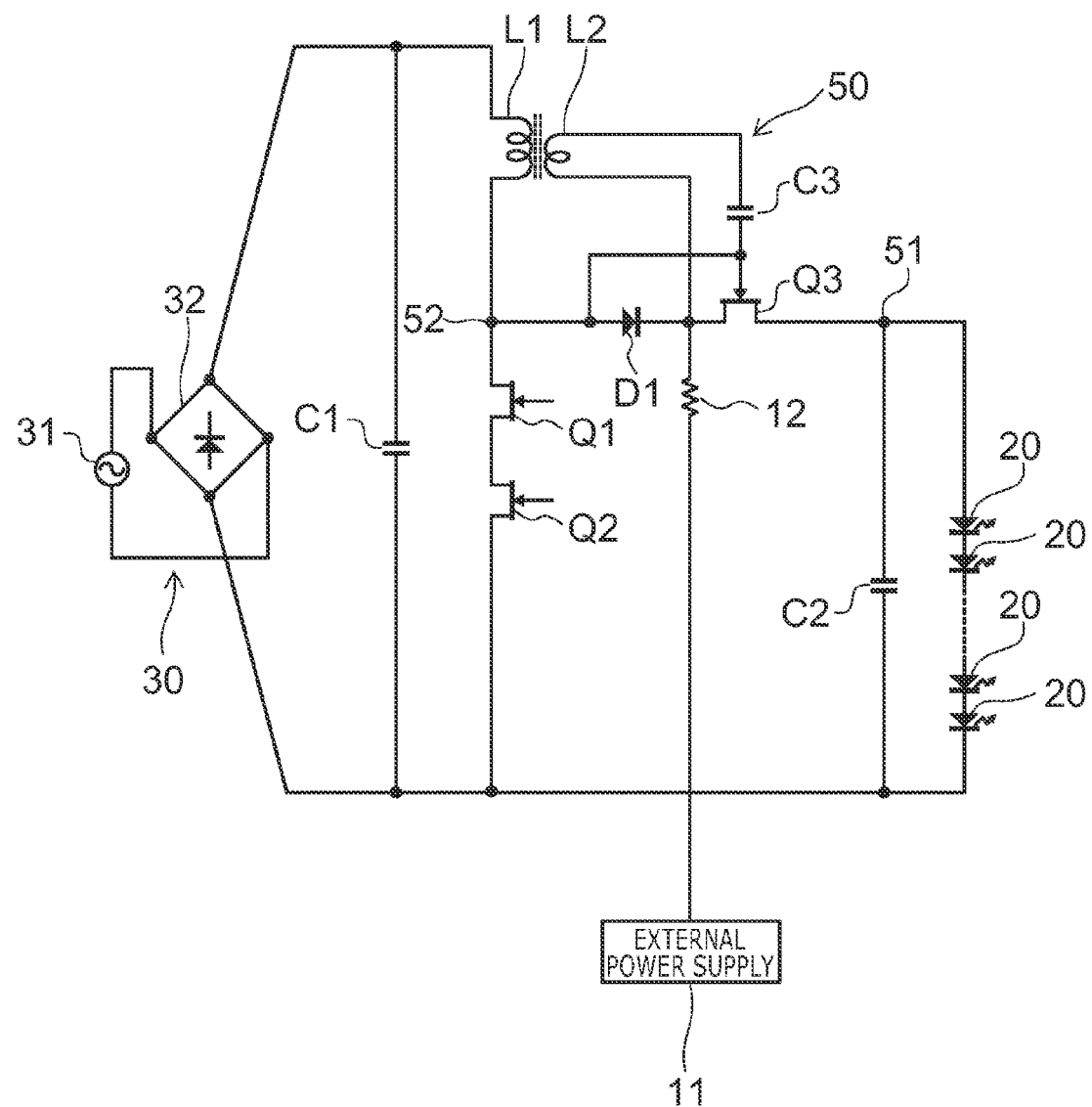
FIG. 5 is a circuit diagram of a power supply circuit of a third embodiment.

FIG. 5 is a circuit view of a rising voltage type converter (boost converter) using a rectifying circuit 50.

A second terminal 52 of the rectifying circuit 50 is connected to an inductor L and high-side switching elements Q1 and Q2. A first terminal 51 is connected to an output terminal of the boost converter.

When the high-side switching elements Q1 and Q2 are turned on, an inductor L1 stores energy by current flowing from a DC power supply 30. When the high-side switching elements Q1 and Q2 are turned off, the inductor L1 releases the stored energy in order to keep current. Then, an electromotive force is generated, and current flows through the rectifying circuit 50. The energy from the inductor L1 is added to an input voltage, and a voltage obtained by boosting the input voltage is outputted.

Figure 6:
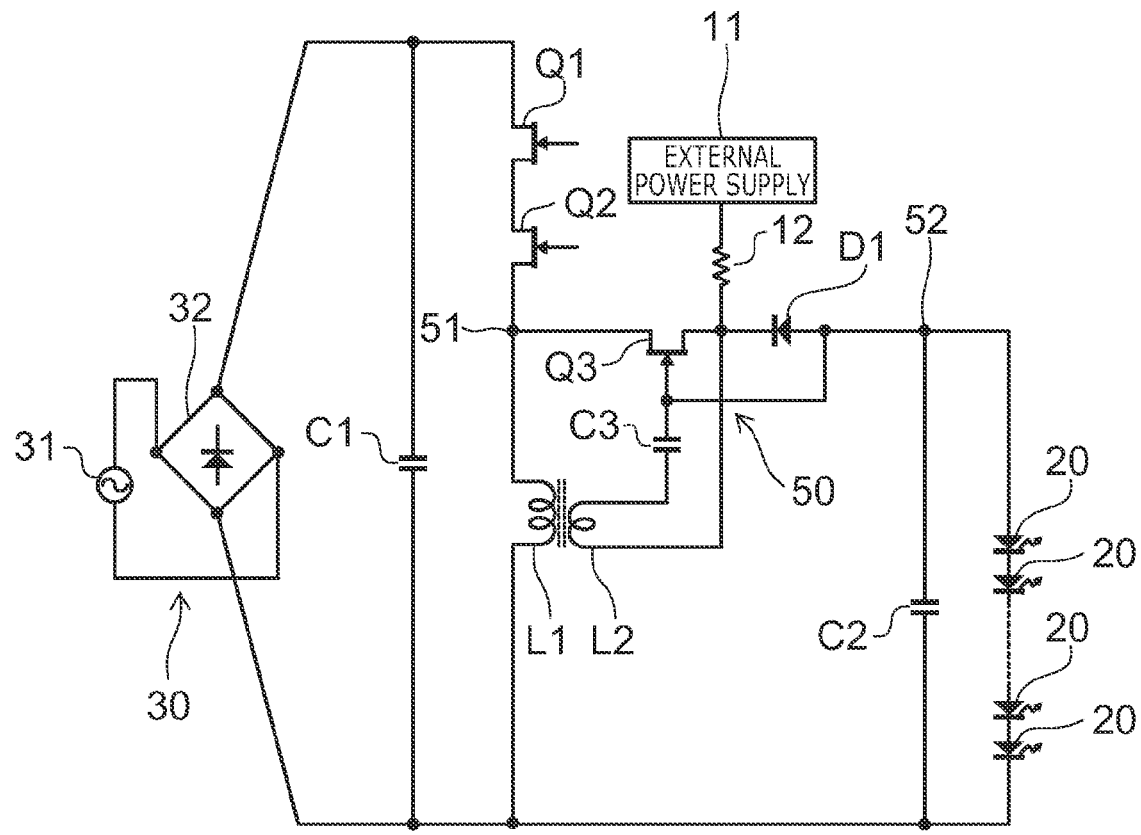
FIG. 6 is a circuit diagram of a power supply circuit of a fourth embodiment.

FIG. 6 is a circuit diagram of a rising-falling type converter (back boost converter) using a rectifying circuit 50.

In the back boost converter, the direction of the rectifying circuit 50 is opposite to that of the back converters shown in FIG. 1 and FIG. 3. The polarity of output voltage is reversed, and both boosting and step down operations can be performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A rectifying circuit comprising:
   a diode connected between a first terminal and a second terminal while a direction directed from the second terminal to the first terminal is a forward direction;
   a switching element including a first main electrode connected to the first terminal, a second main electrode connected to a cathode of the diode, and a gate electrode connected to an anode of the diode;
   a capacitor connected to the gate electrode; and
   an auxiliary winding that is magnetically coupled to an inductor, is connected to the gate electrode through the capacitor, and is connected to the second main electrode of the switching element and the cathode of the diode.

2. The circuit according to claim 1, wherein the auxiliary winding supplies an electric charge to the capacitor by an induced electromotive force generated by a decreasing current flowing through the inductor.

3. The circuit according to claim 1, further comprising:
   an external power supply connected to the auxiliary winding, the second main electrode and the cathode; and
   a limiting element to limit a current in a direction from the auxiliary winding to the external power supply.

4. The circuit according to claim 3, wherein the external power supply applies a voltage, which is lower than an input voltage to cause an increasing current to flow through the inductor, to the second main electrode of the switching element.

5. The circuit according to claim 3, wherein the limiting element includes a resistor.

6. The circuit according to claim 3, wherein the limiting element includes a diode in which a direction directed from the external power supply to the auxiliary winding is a forward direction.

7. The circuit according to claim 1, wherein the diode is a Schottky barrier diode.

8. The circuit according to claim 1, wherein a threshold voltage of the gate electrode of the switching element is lower than a forward voltage of the diode.

9. The circuit according to claim 1, wherein the switching element is a normally-on element.

10. A power supply circuit comprising:
    an inductor; and
    a rectifying circuit including a first terminal and a second terminal, wherein one of the first terminal and the second terminal is connected to the inductor, and wherein
    the rectifying circuit includes
    a diode connected between the first terminal and the second terminal while a direction directed from the second terminal to the first terminal is a forward direction,
    a switching element including a first main electrode connected to the first terminal, a second main electrode connected to a cathode of the diode, and a gate electrode connected to an anode of the diode,
    a capacitor connected to the gate electrode, and an auxiliary winding that is magnetically coupled to the inductor, is connected to the gate electrode through the capacitor, and is connected to the second main electrode of the switching element and the cathode of the diode.

11. The circuit according to claim 10, wherein the circuit supplies a current to a light-emitting element through the inductor and lights the light-emitting element.

12. The circuit according to claim 10, further comprising a falling voltage type converter to output a voltage obtained by decreasing an input voltage to a load.

13. The circuit according to claim 10, further comprising a high-side switching element to supply an increasing current to the inductor in a state where a reverse voltage is applied to the rectifying circuit.

14. The circuit according to claim 13, wherein a decreasing current is supplied to the inductor through the rectifying circuit in a state where the high-side switching element is off.

15. The circuit according to claim 13, further comprising:
an external power supply connected to the auxiliary winding, the second main electrode and the cathode; and
a limiting element to limit a current in a direction from the auxiliary winding to the external power supply.

16. The circuit according to claim 15, wherein the external power supply applies a voltage, which is lower than an input voltage inputted through the high-side switching element, to the second main electrode of the switching element.

17. The circuit according to claim 15, wherein the limiting element includes a resistor.

18. The circuit according to claim 15, wherein the limiting element includes a diode in which a direction directed from the external power supply to the auxiliary winding is a forward direction.

19. The circuit according to claim 10, further comprising a rising voltage type converter to output a voltage obtained by raising an input voltage to a load.

20. The circuit according to claim 10, wherein the auxiliary winding supplies an electric charge to the capacitor by an induced electromotive force generated by a decreasing current flowing through the inductor.

* * * * *